(12) United States Patent
Galat

(10) Patent No.: US 12,704,528 B2
(45) Date of Patent: Aug. 11, 2026

(54) CONTACT SENSOR FOR DETECTING LOOSE SPROCKET SEGMENTS OF A FINAL DRIVE

(71) Applicant: Caterpillar Inc., Peoria, IL (US)

(72) Inventor: Michael S Galat, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 213 days.

(21) Appl. No.: 18/382,906

(22) Filed: Oct. 23, 2023

(65) Prior Publication Data

US 2025/0130255 A1 Apr. 24, 2025

(51) Int. Cl.
*G01R 1/067* (2006.01)
*B62D 55/125* (2006.01)

(52) U.S. Cl.
CPC ........ *G01R 1/06794* (2013.01); *B62D 55/125* (2013.01)

(58) Field of Classification Search
CPC .................................................. G01R 1/06794
See application file for complete search history.

(56) References Cited

U.S. PATENT DOCUMENTS 9,488,212 B2 11/2016 Hsieh
10,190,618 B2 1/2019 Mckinley
2020/0070906 A1 3/2020 Laperle et al.
2021/0317861 A1* 10/2021 Blin ...................... F16B 35/048
2022/0268599 A1 8/2022 Matsunaga
2023/0118122 A1 4/2023 Tadigotla et al.
2024/0288338 A1* 8/2024 Christensen ........... B62D 55/32

FOREIGN PATENT DOCUMENTS

AU 2019332047 3/2021
DE 102014217076 A1 * 3/2016 ............... H04Q 9/00
WO 2023282829 1/2023

OTHER PUBLICATIONS

Translation of DE 102014217076 A1 (Year: 2016).*

* cited by examiner

*Primary Examiner* — Paresh Patel

(57) ABSTRACT

A contact sensor for detecting and notifying a separation of a first component of a machine from a second component of the machine is provided. The contact sensor includes a probe for detecting the separation where the first component and the second component are configured to rotate about a common axis of rotation and the probe is configured to be electrically disconnected at a location of the separation. The contact sensor additionally includes a transmitter that is coupled to the probe and is configured to transmit an alert in response to the probe being electrically disconnected.

20 Claims, 6 Drawing Sheets

CONTACT SENSOR FOR DETECTING LOOSE SPROCKET SEGMENTS OF A FINAL DRIVE

TECHNICAL FIELD

The present disclosure relates to a sensor for detecting a loose sprocket segment of a final drive, and more specifically, for detecting an attached sprocket segment separating from a drive hub of the final drive of a machine.

BACKGROUND

Machines may be used to perform variety of tasks at a worksite. For example, machines may be used to excavate, move, shape, contour, and/or remove material present at the worksite, such as gravel, concrete, asphalt, soil, and/or other materials. Some of these machines utilize tracks, rather than wheels, to provide ground-engaging propulsion. Such tracks may be preferred in environments where creating sufficient traction is problematic, such as those frequently found in the worksites identified above. Specifically, rather than rolling across a work surface on wheels, track-type machines utilize one or more tracks that include an endless loop of coupled track links defining outer surfaces, which support ground-engaging track shoes, and inner surfaces that travel about one or more rotatable track-engaging elements, such as, drive sprockets, a final drive hub or drive hub, idlers, tensioners, and rollers, for example.

During operation of the machine, the bolts securing the sprocket segment to the drive hub may loosen, and cause the bolt holes in the drive hub to enlarge, which causes the sprocket segment to become unusable. The process of replacing the drive hub is very labor intensive and causes the machine to be inoperable for a significant amount of time.

US Patent Application Publication No. 2021/0317861 by Blin ("the '861 application"), published Oct. 14, 2021, describes a fastener with a transmitter that is powered via a switching contact designed to be open when the fastener is installed properly and to be closed when the fastener is released, such that the transmitter is supplied with current and transmits a signal only when the electrical connection of the switching contact is closed. While the '861 application describes monitoring at least one mechanical fastening parameter, the mechanical fastening parameter appears to be limited for the characteristics of the fastener itself, and does not include a state or characteristic of an element that the fastener is used to secure.

The contact sensor described herein are directed to addressing one or more of the draw backs set forth above.

SUMMARY

According to a first aspect, a contact sensor for detecting and notifying a separation of a first component of a machine from a second component of the machine is provided. The contact sensor includes a probe for detecting the separation where the first component and the second component are configured to rotate about a common axis of rotation and the probe is configured to be electrically disconnected at a location of the separation. The contact sensor additionally includes a transmitter that is coupled to the probe and is configured to transmit an alert in response to the probe being electrically disconnected.

According to another aspect, a sprocket segment, capable of detecting and reporting a separation from a drive hub of a machine, is provided. The sprocket segment is to be secured to the drive hub for engaging a track of the machine, and includes a contact sensor for detecting the separation of the sprocket segment from the drive hub. The contact sensor includes a probe configured to be electrically connected to a contact area of the drive hub while the sprocket segment is secured to the drive hub and to be electrically disconnected from the contact area in response to the separation where the contact area is electrically grounded via the drive hub. The contact sensor also includes: a transmitter that is coupled to the probe and is configured to transmit an alert in response to the probe being electrically disconnected; and one or more processors coupled to the probe and the transmitter where the one or more processors configured to detect the separation based on the probe being electrically disconnected and to cause the transmitter to transmit the alert based on detecting the separation.

According to yet another aspect, a drive hub of a machine, capable of detecting and reporting a separation of a sprocket segment from the drive hub, is provided. The drive hub includes a contact sensor for detecting the separation of a sprocket segment from the drive hub. The contact sensor includes a probe disposed flush with a front surface of a rim of the drive hub. The probe is electrically isolated from the drive hub, and is configured to be electrically connected to a contact area of the sprocket segment while the sprocket segment is secured to the drive hub and to be electrically disconnected from the contact area in response to the separation. The contact sensor also includes: a transmitter that is coupled to the probe and is configured to transmit an alert in response to the probe being electrically disconnected:

and one or more processors coupled to the probe and the transmitter where the one or more processors configured to: detect the separation based on the probe being electrically disconnected and to cause the transmitter to transmit the alert based on detecting the separation.

BRIEF DESCRIPTION OF DRAWINGS

The detailed description is described with reference to the accompanying figures. In the figures, the left-most digit of a reference number identifies the figure in which the reference number first appears. The same reference numbers in different figures indicate similar or identical items.

DETAILED DESCRIPTION

Figure 1:
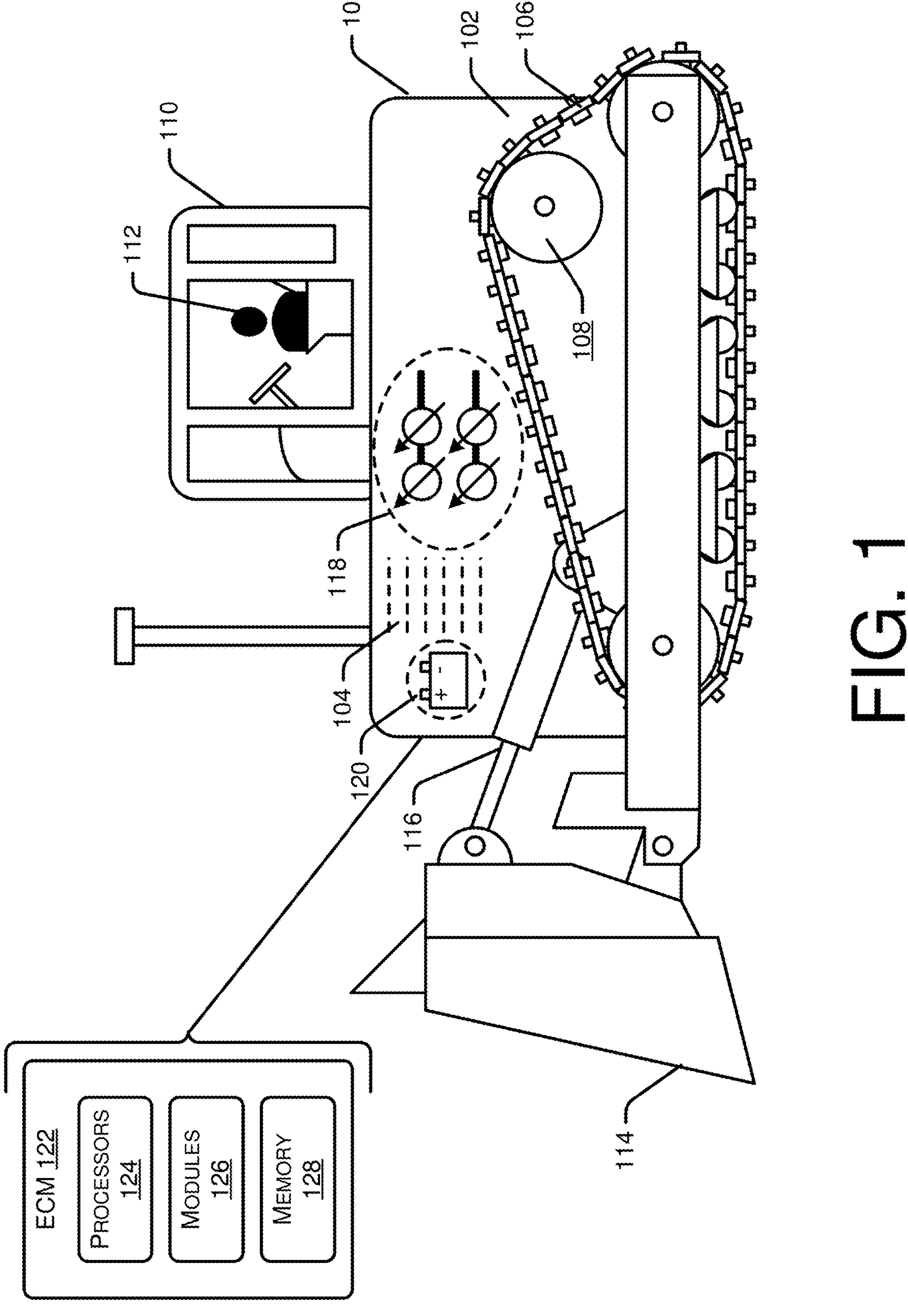
FIG. 1 is a schematic side view of an example machine with tracks for a propulsion system driven by final drives.

FIG. 1 is a schematic side view of an example machine 100 with tracks for a propulsion system driven by final drives. The example machine 100 shown in FIG. 1 is a bulldozer. However, the machine 100 may be any type of work machine configured to travel across and perform operations on terrain, such as such as an agricultural vehicle, and work vehicles, such as a track loader, a track excavator, a paver, a drill rig, and/or any other machine having tracks known to a person skilled in the art.

The machine 100 includes a chassis or frame 102 to which a prime mover 104 is attached. The prime mover 104 may include an internal combustion engine or "engine", a fuel cell, one or more batteries, or other prime mover types. The prime mover 104 is configured to supply power for operation of the machine 100, including, for example, operating work implements, electronics, and steering, and/or for supplying torque to drive members to propel the machine 100 across the terrain. For example, the machine 100 shown in FIG. 1 includes a propulsion system, such as a pair of tracks 106 (only one set of tracks shown), that are configured to propel the machine 100 across pavement, gravel, dirt, or other work surfaces. The track 106 is driven by a final drive 108.

Although the machine 100 includes the tracks 106, it is contemplated that the machine 100 may include one or more wheels in addition to the tracks 106. The machine 100 also includes a cab 110 operationally connected to the frame 102 for protecting and/or providing comfort for an operator 112 of the machine 100, and/or for protecting control-related devices of the machine 100. In some examples, the machine 100 may be semi-autonomous or fully autonomous, and able to operate without an onboard or remote operator, and may not include the cab 110. In examples where the machine 100 is semi-autonomous or fully-autonomous, the machine 100 is prevented from, or avoids, accidentally colliding with or maneuvering undesirably close to other machines, personnel, and/or objects.

In the example shown in FIG. 1, the machine 100 also includes a work implement 114 for performing operations associated with the machine 100, such as digging, carrying, raising, and/or depositing material. Although the work implement 114 in FIG. 1 is illustrated as a shovel, other forms of work implements are contemplated. For example, the work implement 114 may include augers, brushcutters, brooms, grapples, hammers, pulverizers, rippers, rotors, shovels, and so forth. The machine 100 includes a work implement actuator 116 coupled at one end to the frame 102 and/or to the proximal end of the work implement 114. The work implement actuator 116 may be hydraulic cylinders powered by one or more hydraulic pumps 118. The work implement actuator 116 may also be electric motors or pneumatic cylinders. The work implement actuator 116 is configured to extend and retract, thereby pivoting the work implement 114 between an upright orientation and an at least partially inverted orientation, for example. In the upright orientation, the work implement 114 may hold material and in the at least partially inverted orientation, the work implement 114 may deposit or dump the material.

The machine 100 may include a battery 120 to power various electrical equipment in the machine 100 including an electronic control module (ECM) 122. The ECM 122 houses one or more processors 124, which may execute any modules, components, or systems associated with the machine 100, some of which may be housed in the ECM 122 as shown as modules 126. In some examples, the processors 124 may include a central processing unit (CPU), a graphics processing unit (GPU), both CPU and GPU, or other processing units or components known in the art. Additionally, each of the processors 124 may possess its own local memory, which also may store program modules, program data, and/or one or more operating systems.

Computer-readable media, such as memory 128, associated with the machine 100 may include volatile memory (e.g., RAM), non-volatile memory (e.g., ROM, flash memory, miniature hard drive, memory card, or the like), or some combination thereof. The computer-readable media may be non-transitory computer-readable media. The computer-readable media may include or be associated with the one or more of the above-noted modules, which perform various operations associated with the machine 100. In some examples, one or more of the modules may include or be associated with computer-executable instructions that are stored by the computer-readable media and that are executable by one or more processors to perform such operations.

Figure 2:
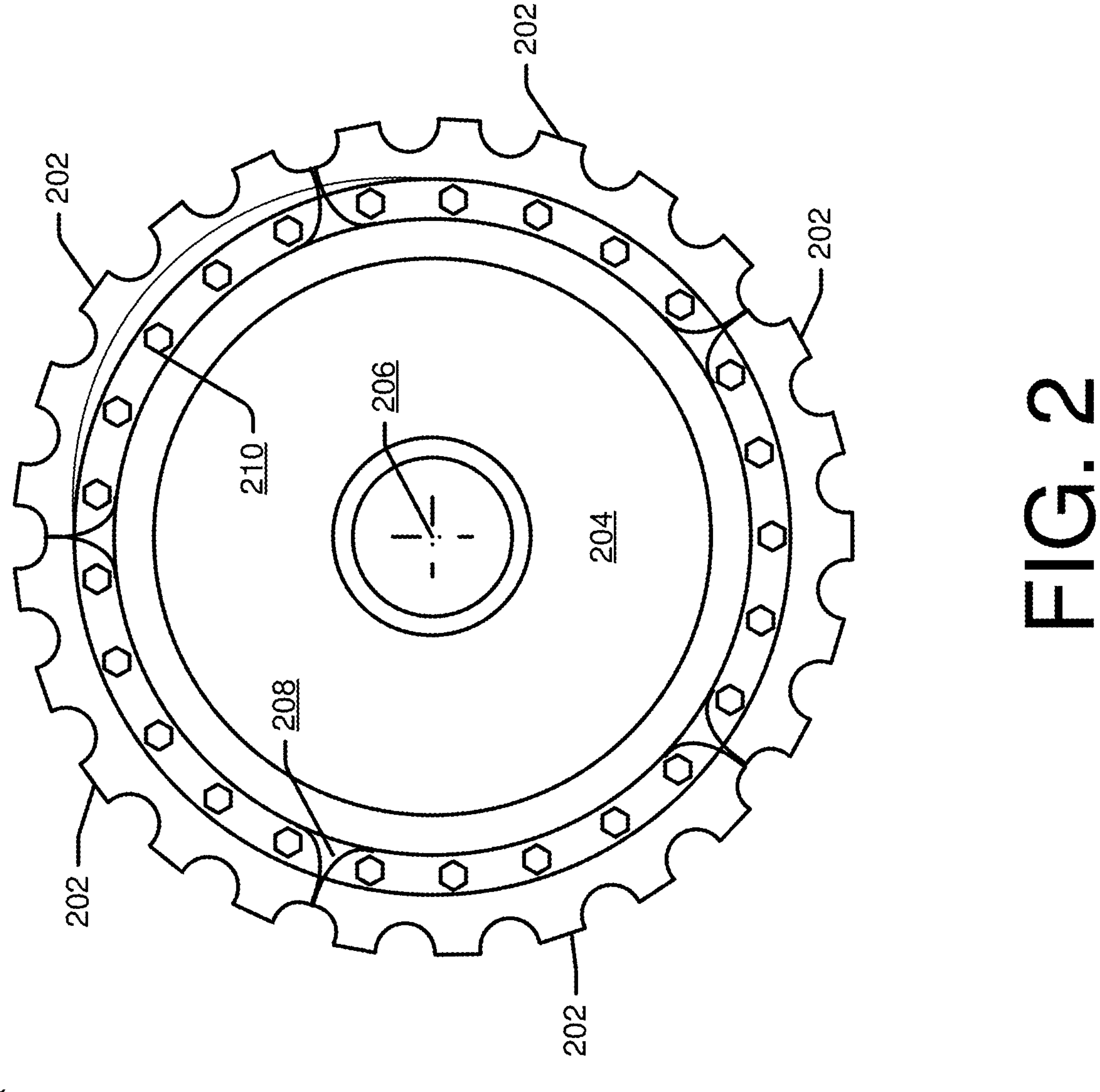
FIG. 2 is a schematic view of a final drive for driving a track.

FIG. 2 is a schematic view of a final drive 108 for driving a track, such as the track 106 of the machine 100. The final drive 108 includes one or more first components, such as a plurality of sprocket segments 202, securely and contiguously attached to, and contacting, a second component, such as a drive hub 204. The sprocket segments 202 and the drive hub 204 are configured to rotate about a common axis of rotation 206. While in this example, five sprocket segments 202 are shown to be secured to a rim 208 of the drive hub 204 by multiple bolts 210, the number of sprocket segments 202 may be different for different drive hubs. A contact sensor in accordance to the present disclosure may be installed, disposed, embedded, or otherwise located, in either of the first component, i.e., the sprocket segment 202, or the second component, i.e., the drive hub 204.

Figure 3:
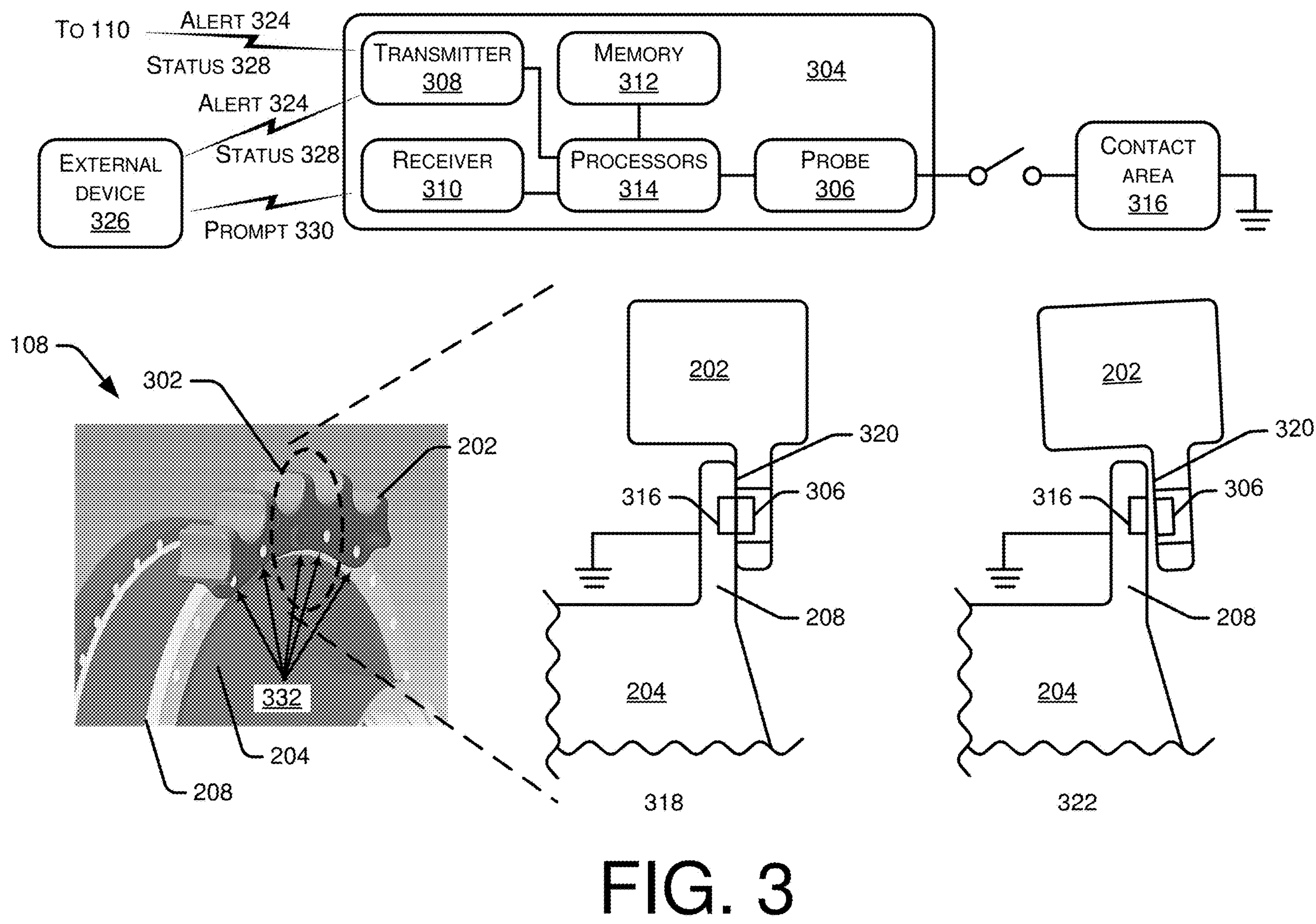
FIG. 3 is a schematic cutaway views of a section of the final drive illustrating a contact sensor in the sprocket segment and a block diagram of the contact sensor.

FIG. 3 is a schematic cutaway view of a section 302 of the final drive 108 illustrating a contact sensor 304 in the sprocket segment 202 and a block diagram of the contact sensor 304. The contact sensor 304 may comprise a probe 306, a transmitter 308, a receiver 310, memory 312, and one or more processors (processors) 314 coupled to the probe 306, the transmitter 308, the receiver 310, and the memory 312, and other components (not shown). The memory 312 may store instructions that, when executed by the processors 314, cause the processors to perform operations described below. While the contact sensor 304 may be disposed in the sprocket segment 202, only the probe 306 is shown in the sprocket segment 202 in this example for clarity.

In a view 318 of the sprocket segment 202 securely attached to the rim 208, the probe 306 is shown to contact a contact area 316. The probe 306 may be disposed in the sprocket segment 202 flush with a mating surface 320 of the sprocket segment 202 such that, when the sprocket segment 202 is securely attached to the rim 208 of the drive hub 204, the probe 306 contacts the contact area 316 of the rim 208. For example, the probe 306 may be electrically isolated from the sprocket segment 202 and the contact area 316 may be grounded via the drive hub 204, which is connected and grounded to the frame 102 of the machine. The processors 314 may detect the probe 306 being grounded and interpret this condition as the sprocket segment 202 being securely attached to the rim 208 of the drive hub 204.

In a view 322 of the sprocket segment 202 separating from the rim 208, the probe 306 is shown to disconnect from the contact area 316. The processors 314 may detect the probe 306 not being grounded, i.e., electrically being disconnected or open circuit, and interpret this condition as the sprocket segment 202 being physically separating from the rim 208 at least at the location of the probe 306. In response to the separation of the sprocket segment 202 from the rim 208, the transmitter 308 may transmit an alert 324. Alternatively, or additionally, the processors 314, in response to detecting the probe 306 not being grounded, may cause the transmitter 308 to transmit the alert. For example, the transmitter 308 may transmit the alert 324 to the cab 110 of the machine 100, or more specifically, to a receiver or a display of the ECM 122 in the cab 110, to indicate or notify the operator 112 that the sprocket segment 202 and the drive hub 204 have separated. The transmitter 308 may also transmit the alert 324 to an external device 326, which may be separate from the machine 100 and associated with a central office owning, maintaining, servicing, or managing the machine 100.

The processors 314 may further be configured to cause the transmitter 308 to transmit a separation status 328 of the sprocket segment 202 and the drive hub 204 periodically, i.e., at a preselected time interval. The separation status 328 may include one of the alert 324 indicating that the sprocket segment 202 and the drive hub 204 have separated or a pass signal indicating that the sprocket segment 202 is, or remains to be, securely attached to the drive hub 204 based on the probe 306 being electrically connected to the contact area 316. The contact sensor 304 may receive, via the receiver 310, a prompt signal 330 from the external device 326, and the processors 314 may cause the transmitter 308 to transmit the separation status 328 to the external device 326 based on the receiver receiving the prompt signal. The contact sensor 304 or the probe 306 may be disposed between two adjacent bolt openings of a plurality of bolt openings 332 of the sprocket segment 202 for receiving bolts for securing the sprocket segment 202 to the drive hub 204 (one opening shown with a bolt head of a bolt securing the sprocket segment 202 to the drive hub 204).

Figure 4:
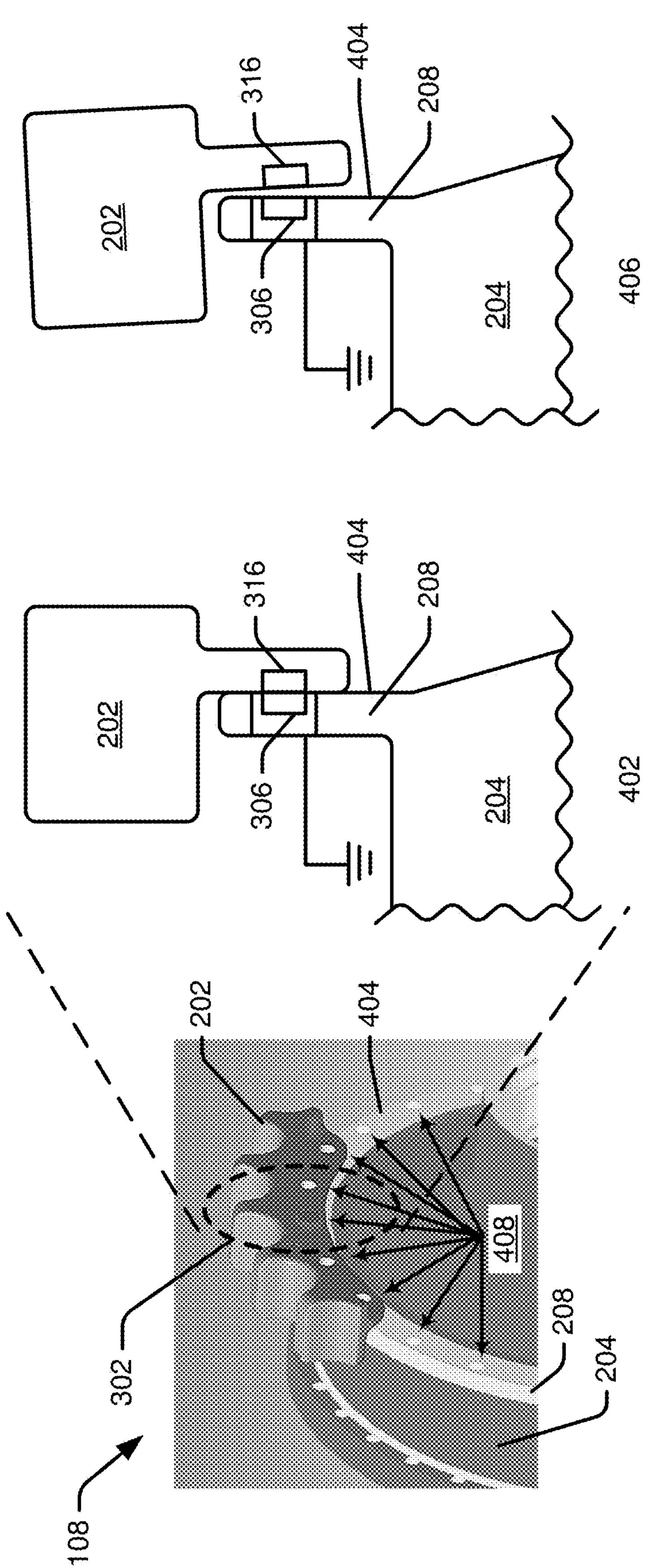
FIG. 4 is a schematic cutaway views of a section of the final drive illustrating the contact sensor in the drive hub.

FIG. 4 is a schematic cutaway view of the section 302 of the final drive 108 illustrating the contact sensor 304 in the drive hub 204. As described above with regard to FIG. 3, the contact sensor 304 may comprise the probe 306, the transmitter 308, the receiver 310, the memory 312, and the processors 314 coupled to the probe 306, the transmitter 308, the receiver 310, and the memory 312, and other components (not shown). While the contact sensor 304 may be disposed in the drive hub 204, only the probe 306 is shown in the drive hub 204 in this example for clarity.

In a view 402 of the sprocket segment 202 securely attached to the rim 208, the probe 306 is shown to contact a contact area 316. The probe 306 may be disposed in the drive hub 204 flush with a front surface 404 of the rim 208 such that, when the sprocket segment 202 is securely attached to the rim 208 of the drive hub 204, the probe 306 contacts the contact area 316 of the sprocket segment 202. For example, the probe 306 may be electrically isolated from the drive hub 204, which is connected and grounded to the frame 102 of the machine. The contact area 316 is connected to the sprocket segment 202 and grounded to the drive hub 204 via physical contact, such as a surface-to-surface contact and with one or more bolts at least partially securing the sprocket segment 202 to rim 208. The processors 314 may detect the probe 306 being grounded and interpret this condition as the sprocket segment 202 being securely attached to the rim 208 of the drive hub 204.

In a view 406 of the sprocket segment 202 separating from the rim 208, the probe 306 is shown to disconnect from the contact area 316. The processors 314 may detect the probe 306 not being grounded, i.e., electrically being disconnected or open circuit, and interpret this condition as the sprocket segment 202 being physically separating from the rim 208 at least at the location of the probe 306. In response to the separation of the sprocket segment 202 from the rim 208, the transmitter 308 may transmit the alert 324. Alternatively, or additionally, the processors 314, in response to detect the probe 306 not being grounded, may cause the transmitter 308 to transmit the alert. As described above with reference to FIG. 3, the transmitter 308 may transmit the alert 324 to the ECM 122 of the machine 100 and to the external device 326 associated with the central office. The separation status 328 may also be transmitted to the external device 326 at the preselected time interval or in response to receiving the prompt signal 330 from the external device 326. The contact sensor 304 or the probe 306 may be disposed between two adjacent bolt openings of a plurality of bolt openings 408 of the rim 208 for receiving bolts for securing the sprocket segment 202 to the drive hub 204 (some bolt openings 408 are covered by the sprocket segment 202, and one opening shown with a bolt head of a bolt securing the sprocket segment 202 to the drive hub 204). The drive hub 204 may house more than one contact sensor, for example, as many as the number of sprocket segments 202 to be secured to the rim 208.

Figure 5:
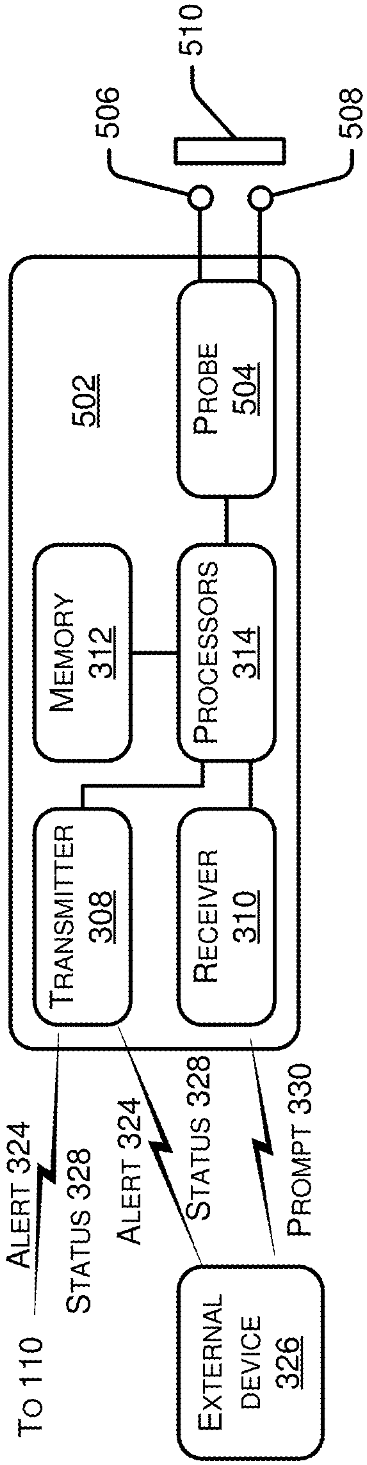
FIG. 5 is a block diagram of a contact sensor with a probe having a different implementation.

FIG. 5 is a block diagram of a contact sensor 502 with a probe 504 having a different implementation from the probe 306. The contact sensor 502 performs similarly to the contact sensor 304 as described above with reference to FIGS. 3 and 4, and includes the same components as the contact sensor 304 except for the probe 504 instead of the probe 306. The probe 504 includes two terminals 506 and 508 that are configured to be connected to each other by a contact area 510 when the sprocket segment 202 is securely attached to the drive hub 204, and disconnected from each other when the sprocket segment 202 is separated from the drive hub 204. The processor 314 may manage the alert 324 and the separation status 328 based on the indicated status of the sprocket segment 202 and the drive hub 204 as described above with reference to FIGS. 3 and 4. The contact area 510 may be located at the same location as the contact area 316 as described above with reference to FIGS. 3 and 4, however, the contact area 510 is electrically isolated from the sprocket segment 202 and the drive hub 204 to prevent the probe 504 from being shorted to the ground.

Figure 6:
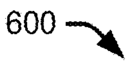
FIG. 6 is a flowchart describing a process of detecting a separation of the sprocket segment from the drive hub.
Figure 6:
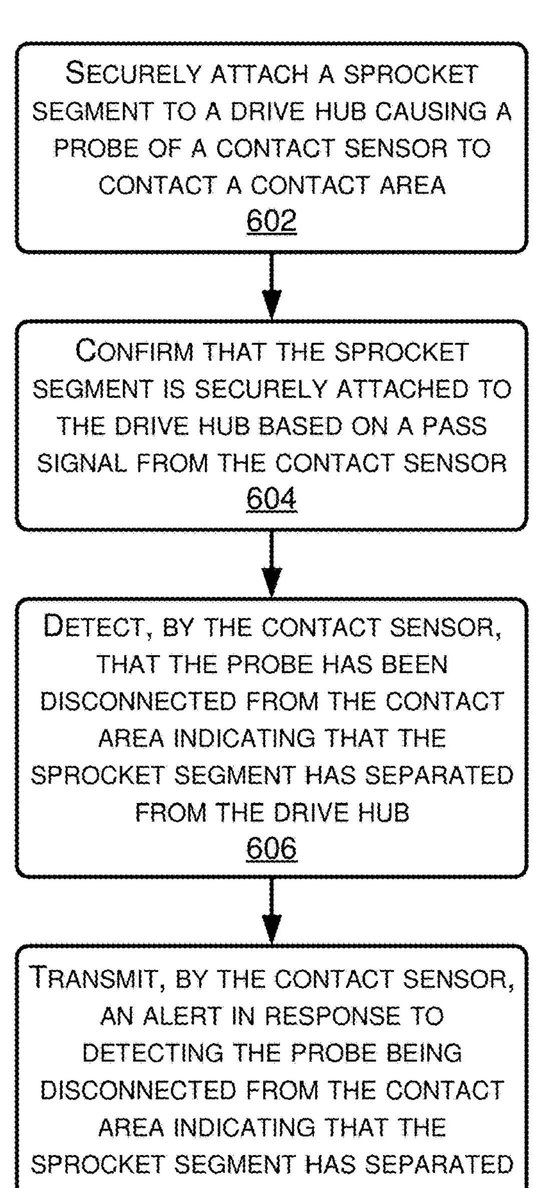

FIG. 6 is a flowchart describing a process 600 of detecting a separation of the sprocket segment 202 from the drive hub 204. At block 602, a sprocket segment, such as the sprocket segment 202 is securely attached to a drive hub, such as the drive hub 204, causing a probe, such as the probe 306 or 504, to connect to a contact area, such as the contact area 316 as described above with reference to FIGS. 3-5. At block 604, the sprocket segment 202 is confirmed to be securely attached to the drive hub 204 based on a pass signal from the contact sensor 304. For example, a prompt signal may be sent from an external device, such as the external device 326, to the contact sensor 304, and in response, the contact sensor 304 may transmit a separation status, such as the separation status 328 including the pass signal. At block 606, the contact sensor 304 may detect the probe 306 or 504 being disconnected from the contact area 316 indicating that the sprocket segment 202 has separated from the drive hub 204. In response to detecting that the probe 306 or 504 has been disconnected from the contact area 316, the contact sensor 304 may transmit an alert, such as the alert 324 indicating that the sprocket segment 202 has separated from the drive hub 204 at block 608.

Some or all operations of the methods described above can be performed by execution of computer-readable instructions stored on a computer-readable storage medium, as defined below: The terms "computer-readable medium." "computer-readable instructions," and "computer executable instructions" as used in the description and claims, include routines, applications, application modules, program modules, programs, components, data structures, algorithms, and the like. Computer-readable and -executable instructions can be implemented on various system configurations, including single-processor or multiprocessor systems, minicomputers, mainframe computers, personal computers, hand-held computing devices, microprocessor-based, programmable consumer electronics, combinations thereof, and the like.

The computer-readable storage media may include volatile memory (such as random-access memory (RAM)) and/or non-volatile memory (such as read-only memory (ROM), flash memory, etc.). The computer-readable storage media may also include additional removable storage and/or non-removable storage including, but not limited to, flash memory, magnetic storage, optical storage, and/or tape storage that may provide non-volatile storage of computer-readable instructions, data structures, program modules, and the like.

A non-transitory computer-readable storage medium is an example of computer-readable media. Computer-readable media includes at least two types of computer-readable media, namely computer-readable storage media and communications media. Computer-readable storage media includes volatile and non-volatile, removable and non-removable media implemented in any process or technology for storage of information such as computer-readable instructions, data structures, program modules, or other data. Computer-readable storage media includes, but is not limited to, phase change memory (PRAM), static random-access memory (SRAM), dynamic random-access memory (DRAM), other types of random-access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer-readable instructions, data structures, program modules, or other data in a modulated data signal, such as a carrier wave, or other transmission mechanism. As defined herein, computer-readable storage media do not include communication media.

The computer-readable instructions stored on one or more non-transitory computer-readable storage media, when executed by one or more processors, may perform operations described above with reference to FIGS. 3-6. Generally, computer-readable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

INDUSTRIAL APPLICABILITY

The example devices of the present disclosure are applicable for detecting a separation of a first component of a machine from a second component of the machine. For example, the first component may be a sprocket segment securely attached to the second component, which may be a drive hub where the sprocket segment and the drive hub are configured to rotate about a common axis of rotation.

During operation of the machine, the bolts securing the sprocket segment to the drive hub may loosen, and cause the bolt holes in the drive hub to enlarge, which causes the sprocket segment to become unusable. The process of replacing the drive hub is very labor intensive and causes the machine to be inoperable for a significant amount of time. A contact sensor of the present disclosure detects and notifies a separation of the first component from the second component before the bolt holes in the drive hub are enlarged and the sprocket segment becomes unusable. The contact sensor includes a probe for detecting the separation, and the probe is configured to be electrically disconnected at a location of the separation. The contact sensor additionally includes a transmitter that is coupled to the probe and is configured to transmit an alert in response to the probe being electrically disconnected. The contact sensor may be embedded in the sprocket segment or the drive hub.

Unless explicitly excluded, the use of the singular to describe a component, structure, or operation does not exclude the use of plural such components, structures, or operations or their equivalents. The use of the terms "a" and "an" and "the" and "at least one" or the term "one or more," and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B" or one or more of A and B") is to be construed to mean one item selected from the listed items (A or B) or any combination of two or more of the listed items (A and B: A, A and B: A, B and B), unless otherwise indicated herein or clearly contradicted by context. Similarly, as used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

While aspects of the present disclosure have been particularly shown and described with reference to the examples above, it will be understood by those skilled in the art that various additional embodiments may be contemplated by the modification of the disclosed devices, systems, and methods without departing from the spirit and scope of what is disclosed. Such embodiments should be understood to fall within the scope of the present disclosure as determined based upon the claims and any equivalents thereof.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein.

What is claimed is:

1. A contact sensor comprising:

a probe disposed in a first component of a machine, the probe for detecting a separation of the first component from a second component of the machine, the first component securely attached to the second component and the probe electrically connected to a contact area of the second component, the probe configured to be electrically disconnected from the contact area at a location of the separation; and a transmitter coupled to the probe, the transmitter configured to transmit an alert in response to the probe being electrically disconnected from the contact area, wherein:

the first component and the second component form a final drive of the machine, the first component and the second component rotate about a common axis of rotation, the final drive is configured to engage a track of the machine, and the track comprises an endless loop of coupled track links.

2. The contact sensor of claim 1, wherein the transmitter is further configured to transmit the alert to a receiver in a cab of the machine, the alert indicating that the first component and the second component have separated.

3. The contact sensor of claim 1, further comprising:

one or more processors coupled to the probe and the transmitter, the one or more processors configured to:

detect the separation based on the probe being electrically disconnected from the contact area, and cause the transmitter to transmit the alert based on detecting the separation.

4. The contact sensor of claim 3, wherein the one or more processors are further configured to cause the transmitter to transmit a separation status of the first component and the second component at a preselected time interval, the separation status includes one of the alert or a pass signal, the pass signal indicating that the first component is securely attached to the second component based on the probe being electrically connected to the contact area.

5. The contact sensor of claim 4, further comprising:

a receiver coupled to the one or more processors, the receiver configured to receive a prompt signal from an external device, wherein the one or more processors are further configured to cause the transmitter to, based on the receiver receiving the prompt signal, transmit the separation status to the external device.

6. The contact sensor of claim 5, wherein the external device includes at least one of:

an electronic control module (ECM) of the machine, or a device separate from the machine.

7. The contact sensor of claim 1, wherein:

the probe is further configured to:

connect with the second component at the contact area to be electrically grounded, and disconnect from the contact area in response to the separation to be electrically open.

8. The contact sensor of claim 7, wherein the contact sensor is disposed between two adjacent bolt openings of a plurality of bolt openings of the first component, the plurality of bolt openings for receiving bolts for securing the first component to the second component.

9. The contact sensor of claim 7, wherein:

the second component is electrically grounded, and the probe is electrically isolated from the first component.

10. The contact sensor of claim 1, wherein the contact area is located at a rim of the second component.

11. The contact sensor of claim 10, wherein:

the first component is a sprocket segment of a plurality of sprocket segments, and the plurality of sprocket segments is contiguously attached to the rim.

12. The contact sensor of claim 1, wherein:

the contact area is electrically isolated from the second component, and the probe comprises two terminals, the two terminals configured to be:

electrically connected to each other by the contact area when the first component is securely attached to the second component, and electrically disconnected from each other when the first component is separated from the second component.

13. The contact sensor of claim 12, wherein the transmitter is further configured to transmit the alert in response to the two terminals being electrically disconnected from each other.

14. A sprocket segment to be secured to a drive hub of a machine, the sprocket segment comprising:

a contact sensor for detecting a separation of the sprocket segment from the drive hub, the contact sensor comprising:

a probe configured to be electrically connected to a contact area of the drive hub while the sprocket segment is secured to the drive hub and to be electrically disconnected from the contact area in response to the separation, the contact area being electrically grounded via the drive hub;

a transmitter coupled to the probe, the transmitter configured to transmit an alert in response to the probe being electrically disconnected from the contact area; and one or more processors coupled to the probe and the transmitter, the one or more processors configured to:

detect the separation based on the probe being electrically disconnected from the contact area, and cause the transmitter to transmit the alert based on detecting the separation, wherein:

a final drive of the machine is formed by a plurality of sprocket segments and the drive hub, the plurality of sprocket segments and the drive hub rotate about a common axis of rotation, the final drive is configured to engage a track of the machine, and the track comprises an endless loop of coupled track links.

15. The sprocket segment of claim 14, wherein the contact sensor further comprises:

a receiver coupled to the one or more processors, the receiver configured to receive a prompt signal from an external device, wherein the one or more processors are further configured to cause the transmitter to, based on the receiver receiving the prompt signal, transmit to the external device a separation status of the sprocket segment, the separation status including one of the alert indicating the sprocket segment being separated from the drive hub or a pass signal indicating the sprocket segment is attached to the drive hub based on the probe being connected to the contact area.

16. The sprocket segment of claim 15, wherein the external device includes at least one of:

an electronic control module (ECM) of the machine, or a device separate from the machine.

17. The sprocket segment of claim 16, further comprising:

a plurality of bolt openings for receiving bolts for securing the sprocket segment to the drive hub, wherein the contact sensor is disposed between two adjacent bolt openings of the plurality of bolt openings.

18. The sprocket segment of claim 14, wherein:

the sprocket segment is a first sprocket segment of a plurality of sprocket segments, and the plurality of sprocket segments is configured to be contiguously secured to a rim of the drive hub.

19. A drive hub of a machine comprising:

a contact sensor for detecting a separation of a sprocket segment from the drive hub, the contact sensor comprising:

a probe disposed flush with a front surface of a rim of the drive hub and electrically isolated from the drive hub, the probe configured to be electrically connected to a contact area of the sprocket segment while the sprocket segment is secured to the drive hub and to be electrically disconnected from the contact area in response to the separation;

a transmitter coupled to the probe, the transmitter configured to transmit an alert in response to the probe being electrically disconnected from the contact area; and one or more processors coupled to the probe and the transmitter, the one or more processors configured to:

detect the separation based on the probe being electrically disconnected from the contact area, and cause the transmitter to transmit the alert based on detecting the separation, wherein:

a final drive of the machine is formed by a plurality of sprocket segments and the drive hub, the plurality of sprocket segments and the drive hub rotate about a common axis of rotation, the final drive is configured to engage a track of the machine, and the track comprises an endless loop of coupled track links.

20. The drive hub of claim 19, wherein the contact sensor further comprises:

a receiver coupled to the one or more processors, the receiver configured to receive a prompt signal from an external device, wherein the one or more processors are further configured to cause the transmitter to, based on the receiver receiving the prompt signal, transmit to the external device a separation status of the sprocket segment, the separation status including one of the alert indicating the sprocket segment being separated from the drive hub or a pass signal indicating the sprocket segment is attached to the drive hub based on the probe being connected to the contact area.

* * * * *